United States Patent
Yamasaki et al.

(10) Patent No.: US 6,907,824 B2
(45) Date of Patent: Jun. 21, 2005

(54) SCREEN PRINTING APPARATUS AND METHOD OF THE SAME

(75) Inventors: Kimiyuki Yamasaki, Fukuoka (JP); Michinori Tomomatsu, Fukuoka (JP); Seikoh Abe, Fukuoka (JP); Seiichi Miyahara, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 119 days.

(21) Appl. No.: 10/600,312

(22) Filed: Jun. 20, 2003

(65) Prior Publication Data
US 2004/0079244 A1 Apr. 29, 2004

Related U.S. Application Data

(62) Division of application No. 09/907,188, filed on Jul. 17, 2001, now Pat. No. 6,609,458.

(30) Foreign Application Priority Data

Jul. 18, 2000 (JP) ........................................ 2000-216941
Jul. 18, 2000 (JP) ........................................ 2000-216942
Jul. 18, 2000 (JP) ........................................ 2000-216943

(51) Int. Cl.$^7$ .............................. B41M 1/12; H05K 3/34
(52) U.S. Cl. .................... 101/129; 101/484; 427/10; 382/150
(58) Field of Search ................................ 101/114, 127, 101/129, 484; 427/8, 9, 10; 382/150

(56) References Cited

U.S. PATENT DOCUMENTS

| 4,610,200 | A | | 9/1986 | Metso |
| 5,052,291 | A | | 10/1991 | Takahashi et al. |
| 5,134,665 | A | | 7/1992 | Jyoko |
| 5,176,078 | A | | 1/1993 | Homma et al. |
| 5,459,941 | A | | 10/1995 | Lowe |
| 5,553,538 | A | | 9/1996 | Freitag |
| 5,709,905 | A | | 1/1998 | Shaw et al. |
| 5,730,051 | A | | 3/1998 | Takahashi et al. |
| 5,735,203 | A | * | 4/1998 | Taniguchi et al. .......... 101/126 |
| 5,740,729 | A | | 4/1998 | Hikita et al. |
| 5,752,446 | A | | 5/1998 | Squibb |
| 5,882,720 | A | * | 3/1999 | Legault et al. ................. 427/8 |
| 6,036,994 | A | | 3/2000 | Tanaka et al. |
| 6,131,511 | A | | 10/2000 | Wachi et al. |
| 6,715,413 | B2 | * | 4/2004 | Yamasaki et al. ........... 101/123 |
| 6,820,545 | B2 | * | 11/2004 | Yamasaki et al. ........... 101/123 |

FOREIGN PATENT DOCUMENTS

| EP | 842772 | * | 5/1998 |
| GB | 2 362 132 A | | 11/2001 |
| JP | 01-99286 | | 4/1989 |
| JP | 01-276692 | * | 11/1989 |
| JP | 5-107191 | * | 4/1993 |
| JP | 5-107193 | * | 4/1993 |
| JP | 06-155706 | | 6/1994 |
| JP | 11-348233 | * | 12/1999 |
| JP | 2001-253047 | * | 9/2001 |

* cited by examiner

*Primary Examiner*—Stephen R. Funk
(74) *Attorney, Agent, or Firm*—RatnerPrestia

(57) ABSTRACT

A screen printing apparatus prints cream solder through a pattern hole of a mask plate, to which a substrate is brought into contact, by sliding a squeegee head. A three dimensional detector, such as a laser, is used to determine the extent to which the pattern hole is filled with the cream solder. Based on the determination result, the printing operation is modified, with respect to the positioning of the mask plate and substrate, to maintain the printing quality.

3 Claims, 10 Drawing Sheets

FIG. 9

| Creamy solder paste 3 |
| Creamy solder paste 2 |
| Creamy solder paste 1 |

| Electrode dimensions | Mask thickness | Parameters |
|---|---|---|
| AA-BB | taa-tbb | |
| | tbb-tcc | |
| | | |
| | | |
| BB-CC | taa-tbb | |
| | tbb-tcc | |
| | | |
| | | |

SCREEN PRINTING APPARATUS AND METHOD OF THE SAME

This application is a divisional of U.S. patent application Ser. No. 09/907,188, filed Jul. 17, 2001, which has issued a U.S. Pat. No. 6,609,458 on Aug. 26, 2003.

FIELD OF THE INVENTION

The present invention relates to a screen printing apparatus for printing paste, such as cream solder or conductive paste, onto a substrate, and a method of the same.

BACKGROUND OF THE INVENTION

A screen printing method has been used for printing paste such as cream solder onto a substrate in a parts-mounting-process by a part-mounting-machine. This method works as this: first, overlay a maskplate on a substrate, the mask-plate has pattern holes corresponding to spots to be printed on the substrate. Then supply cream solder on the mask-plate, and slide a squeegee. Cream solder is thus printed onto the target spots through the pattern holes.

A highly accurate printing by this printing method would require the following two points:

First, a substrate must be accurately positioned with respect to a mask plate. In other words, the substrate must be accurately positioned to the mask plate in a horizontal direction, and the substrate must solidly adhere to the lower face of the mask plate. Therefore, when the apparatus starts on or a model is changed in the mounting line, various adjustments must be done in order to position a substrate accurately to the mask plate. The adjustments include preparing machine-parameters of a moving table of a substrate-positioning-section.

Second, the cream solder must be filled up in the pattern holes when the squeegee is slid, and various printing conditions should be set appropriately to an object to be printed. For instance, a squeegeeing speed on the screen mask, a pressure urging the squeegee against the screen mask and other parameters are to be prepared depending on the characteristics of the object to be printed.

These printing conditions have been set by skilled workers based on their experience and personal know-how. In other words, before actual printing starts, fill-in condition of the cream solder is inspected with human eyes on a trial printing stage, then the condition is corrected by the skilled worker based on the experience and intuition. The printing conditions are thus manually prepared.

However, even if these conditions are adjusted correctly, the substrates are not always positioned exactly with the mask plate at actual printing. There are dispersions on dimensions of the substrates, aged deformation of the mask plate, and looseness of mounting the mask plate. These factors would deviate the pattern holes from the correct positions. Further, gaps would be produced between the substrate and the lower face of the mask plate.

In these cases, defects such as "deviation" of a printed spot from the target one or "blur" of the paste from the printed spot are produced. As such, in the conventional printing method, deviation of the substrate from the mask plate tends to occur, and it is difficult to keep a stable printing quality.

In screen printing, since the squeegee is horizontally moved while it is urged to the mask plate, an external force is applied to the mask plate so that the mask plate is pulled by the squeegee in the lateral direction. This external force repeatedly works on the mask plate at every printing operation, which could loosen the mounting condition of the mask plate or extend the mask plate. As a result, even if the substrate is correctly positioned, the movement of the squeegee at every printing deviates the mask plate relatively from the substrate, and a printing position cannot be exactly maintained.

In these days it becomes difficult to keep the skilled workers. Further, limited production of a variety of products becomes more popular, thus the printing conditions must be changed frequently at every model change. Since the printing conditions are manually prepared, the frequent changes take time and labor, which, as a result, prevents the productivity from improving.

Once the printing conditions are set, the fill-in condition of cream solder is not necessarily kept stable because the cream solder changes over the time, so that the printing quality becomes unstable.

As such, the conventional screen printing apparatus has problems such as (1) preparing the printing conditions takes time and labor, (2) it is difficult to stabilize the printing quality due to dispersion of the printing conditions.

SUMMARY OF THE INVENTION

A method of screen printing comprises the steps of:
(a) detecting a position of a mask plate having a pattern hole relative to a substrate;
(b) determining an extent to which the hole is filled with paste; and
(c) modifying printing on the substrate using the mask based on the determined extent.

BRIEF DESCRIPTION OF THE DRAWINGS

FIG. 9 shows data of library of screen printing conditions of the screen printing apparatus shown in FIG. 1.

Figure 1:
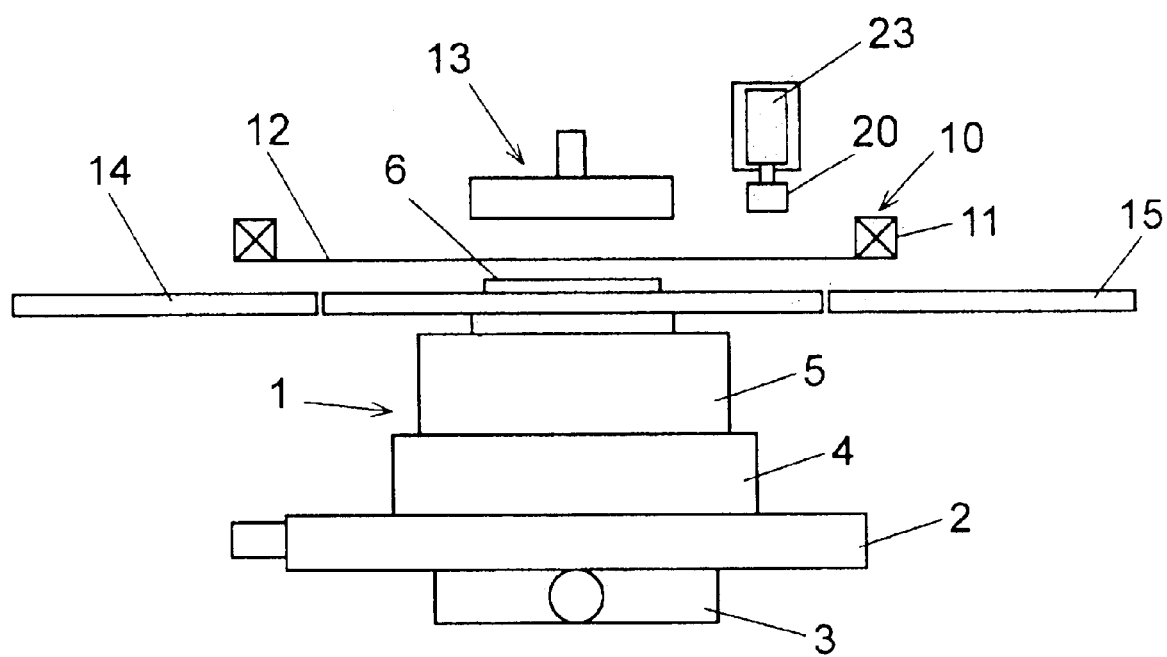
FIG. 1 is a front view of a screen printing apparatus in accordance with an exemplary embodiment.

The entire disclosure of U.S. patent application Ser. No. 09/907,188, filed Jul. 17, 2001, which has issued a U.S. Pat. No. 6,609,458 on Aug. 26, 2003, is expressly incorporated by reference herein.

DETAILED DESCRIPTION OF THE INVENTION

The present invention aims to provide a screen printing apparatus and a method of the same. Positional deviation of a substrate from a mask plate can be prevented and printing conditions can be prepared easily without dispersion by the apparatus and the method. As a result, quality printing can be maintained.

The screen printing apparatus of the present invention comprises the following elements:

(a) substrate-positioning-means for positioning a substrate relatively to a mask plate having pattern holes;

(b) three-dimensional measuring means for detecting the positioned status by measuring the mask plate from its above, the substrate being positioned to the mask plate; and (c) control means for driving the substrate-positioning-means to correct the positioning based on a result detected by the three-dimensional measuring means.

In this apparatus, the mask plate is overlaid on the substrate, and a squeegee head is slid on the mask plate, so that paste is printed on the substrate through the pattern holes.

Another screen printing apparatus of the present invention comprises the following elements:

(a) substrate positioning means for positioning a substrate relatively to a mask plate having pattern holes based on printing position data;

(b) mask position measuring means for measuring a horizontal position of the mask plate to which the substrate is positioned; and (c) storing means for storing print-position-data corrected based on a measurement result by the mask position measuring means.

In this apparatus, the mask plate is overlaid on the substrate, and a squeegee head is slid on the mask plate, so that paste is printed on the substrate through the pattern holes.

Still another screen printing apparatus of the present invention comprises the following elements:

(a) substrate positioning means for positioning a substrate relatively to a mask plate having pattern holes;

(b) fill-in status detecting means for detecting fill-in status of cream solder in the pattern holes by measuring the mask plate from its above in a three-dimensional way;

(c) printing condition modifying means for modifying printing conditions based on a result detected by the fill-in status detecting means;

(d) storing means for storing the printing conditions modified.

In this apparatus, the mask plate is overlaid on the substrate, and a squeegee head is slid on the mask plate, so that paste is printed on the substrate through the pattern holes.

The methods of screen printing according to the present invention are for printing paste on a substrate through pattern holes by sliding a squeegee head on a mask plate. The mask plate having the pattern holes is overlaid on the substrate.

The method of screen printing according to the present invention comprises the steps of:

(a) detecting a positioned status by measuring a mask plate from its above in a three-dimensional way, the substrate being positioned to the mask plate; and (b) correcting the positioned status through controlling substrate-positioning-means by control means based on a detection result obtained in step (a).

Another method of screen printing according to the present invention comprises the steps of:

(a) positioning a substrate with respect to a mask plate based on print position data;

(b) measuring a positional deviation of the mask plate due to printing action by measuring the horizontal position of the mask plate before and after the printing action, the substrate being positioned to the mask plate; and (c) storing the printing position data corrected based on the step (b).

Still another method of screen printing according to the present invention comprises the steps of:

(a) detecting a fill-in status of cream solder by measuring a mask plate from its above with three-dimensional-measuring means, the mask plate being filled up with cream solder in its pattern holes by a squeegee;

(b) correcting printing conditions based on the result obtained in step (a); and (c) storing the printing conditions corrected into storing means.

The present invention, having the structures or steps discussed above, realizes the following advantages:

(1) The mask plate, to which a substrate is positioned, is measured from its above in a three-dimensional way for detecting the positioned status, and the positioned status is corrected based on the detection result, so that an exact positioning is always carried out, and as a result, quality printing can be kept.

(2) A horizontal position of the mask plate, to which a substrate is positioned, is measured before and after a printing action, so that a positional deviation of the mask plate due to the printing action is measured. Then printing-position-data is corrected based on this detection result, thereby keeping the exact printing position.

(3) A screen mask, of which pattern holes is filled up with cream solder by the squeegee, is measured from its above with three-dimensional means for detecting a fill-in status of the cream solder. Screen printing conditions are corrected based on this detection result, so that the printing conditions can be prepared easily without dispersion.

Figure 2:
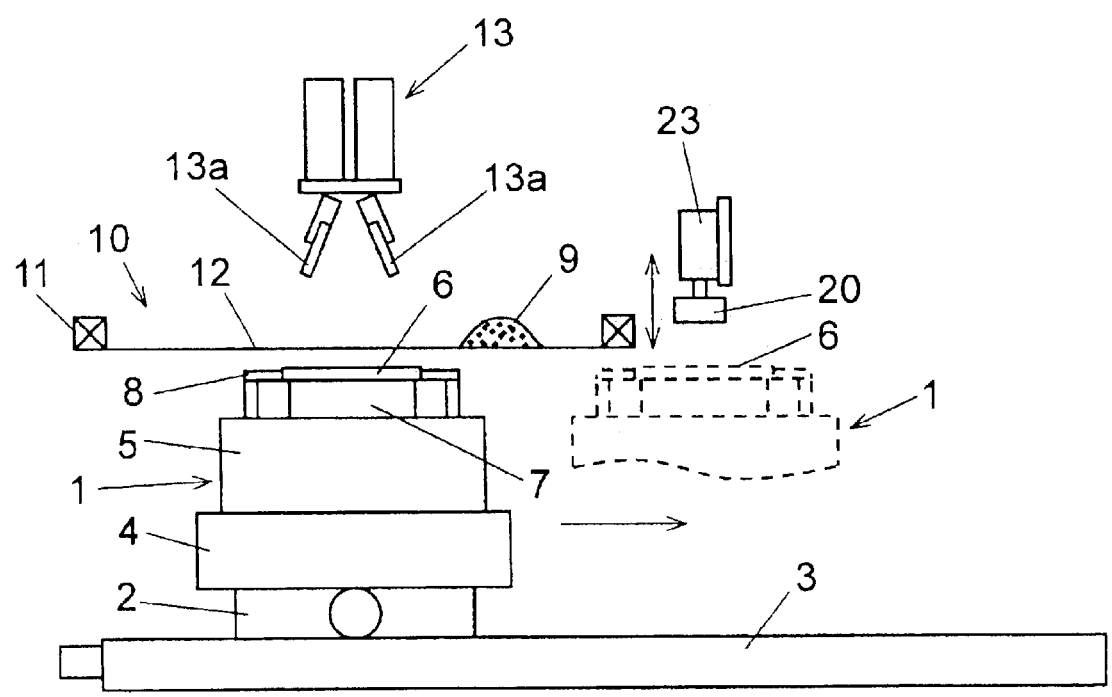
FIG. 2 is a lateral view of the screen printing apparatus shown in FIG. 1.
Figure 3:
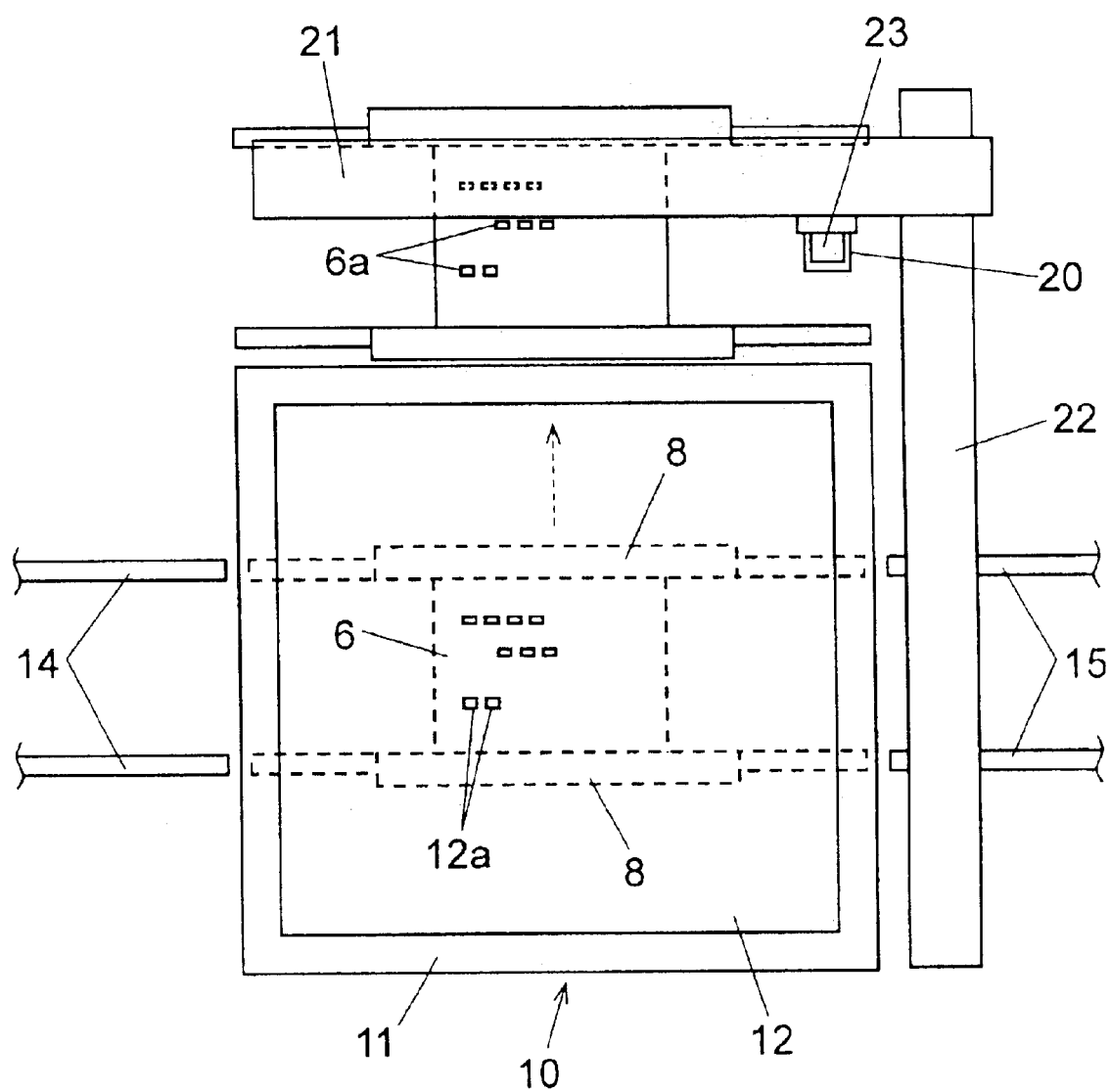
FIG. 3 is a plan view of the screen printing apparatus shown in FIG. 1.

An exemplary embodiment of the present invention is demonstrated with reference to the accompanying drawings. First, a structure of a screen printing apparatus is described. FIG. 1 is a front view of a screen printing apparatus in accordance with the exemplary embodiment. FIG. 2 is a lateral view, and FIG. 3 is a plan view of the screen printing apparatus.

In FIG. 1 and FIG. 2, substrate-positioning-section 1, functioning as means for positioning a substrate, is formed by placing θ-axis table 4 on top of a moving table, and further, placing Z-axis table 5 on top of table 4. The moving table comprises X-axis table 2 and Y-axis table 3. On table 5, substrate-holder 7 is provided, which holds upwardly substrate 6 clamped by clamp 8. Substrate 6, an object of printing, is fed into substrate positioning section 1 by carry-in conveyer 14 shown in FIGS. 1 and 3. The position of substrate 6 can be adjusted by driving substrate-positioning-section 1. After being printed, substrate 6 is transferred by carry-out conveyer 15.

Screen mask 10 is disposed above positioning section 1. Mask 10 is formed by mounting mask plate 12 to holder 11. Substrate 6 is positioned to mask plate 12 by positioning section 1, and brought upwardly into contact with mask plate 12.

Above mask 10, squeegee head 13 is disposed such that head 13 can shuttle back and forth in a horizontal direction. While substrate 6 is put under and in contact with the lower face of mask plate 12, cream solder 9 (paste) is supplied onto mask plate 12. Squeegee 13a of head 13 is placed on mask plate 12, then slid, so that solder 9 is printed on electrode 6a (refer to FIG. 3) formed on substrate 6 via pattern holes 12a provided on mask plate 12.

Above mask 10, laser-measuring-device 20, functioning as three-dimensional measuring means, is disposed. As shown in FIG. 3, laser measuring device 20 is movable horizontally in X, Y directions by X-axis table 21 and Y-axis table 22 as well as movable vertically by lift means 23 (refer to FIGS. 1, 2). In other words, device 20 is lowered to a measuring place by driving lift means 23. X-table 21, Y-table 22 and lift means 23 function as moving means for moving laser-measuring-device 20.

Figure 4:
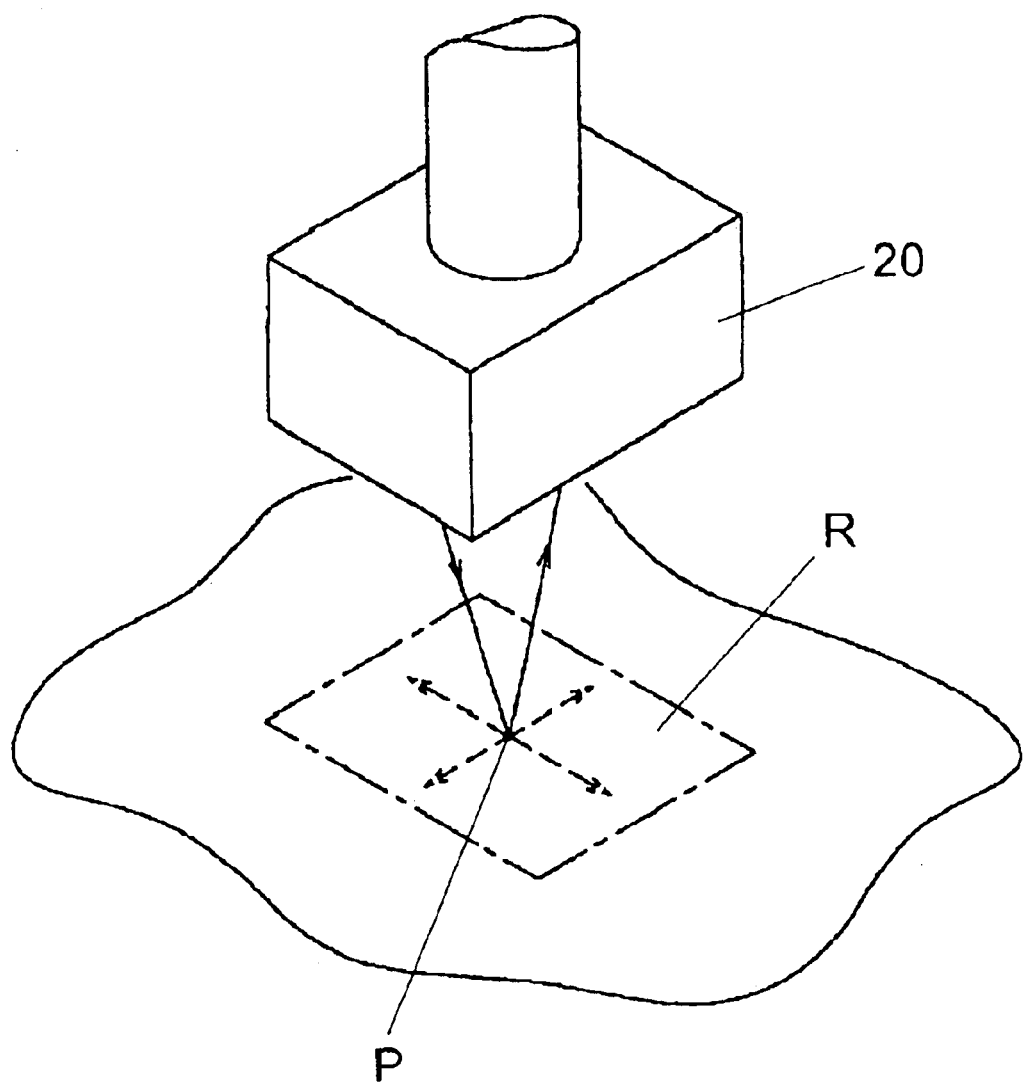
FIG. 4 is a perspective view of a laser measuring device in the screen printing apparatus shown in FIG. 1.

Laser measuring device 20 has two functions, one is to measure a vertical displacement by irradiating laser beam, and the other is a scanning function of scanning a laser-irradiating-position in X, Y directions. FIG. 4 is a perspective view of device 20. As shown in FIG. 4, irradiating point P is scanned within measuring range R, thereby detecting sequentially the vertical positions of the object's surface within range R. As a result, a three-dimensional shape of the object can be detected.

Device 20 is moved by the moving means with respect to substrate 6 and mask plate 12, whereby the shapes of substrate 6 and mask plate 12 in any ranges can be measured from above in a three-dimensional way. Then the detection data obtained is processed, thereby detecting electrode 6a (features of substrate 6), pattern holes 12a (features of mask plate 12) and the holes for detecting the position. As a result, a horizontal position of mask plate 12 can be detected.

In other words, laser measuring device 20 functions as a mask-position-measuring means for detecting the horizontal position of mask plate 12. Devices other than laser measuring device 20 (three-dimensional measuring means) can be used as mask-position-measuring means, e.g., features such as recognition marks provided on mask plate 12 can be shot by a camera then the positions of the features can be recognized through Image-processing.

Further, substrate 6 undergoing screen printing is regarded as a measuring object, and laser measuring device 20 measures substrate 6 in a three-dimensional way, thereby detecting a shape of cream solder 9 printed on substrate 6 in a three-dimensional way. As a result, the print can be inspected, i.e., a position and a printed amount of solder 9 are determined whether or not they are acceptable.

When substrate 6 is positioned with respect to mask plate 12, i.e., substrate 6 is positioned to mask plate 12 in the horizontal direction and placed under and in contact with the lower face of mask plate 12, the three-dimensional measuring is carried out from above mask plate 12. As a result, a positioned status can be detected, which is hereinafter described with reference to FIGS. 6, 7.

Figure 6A:
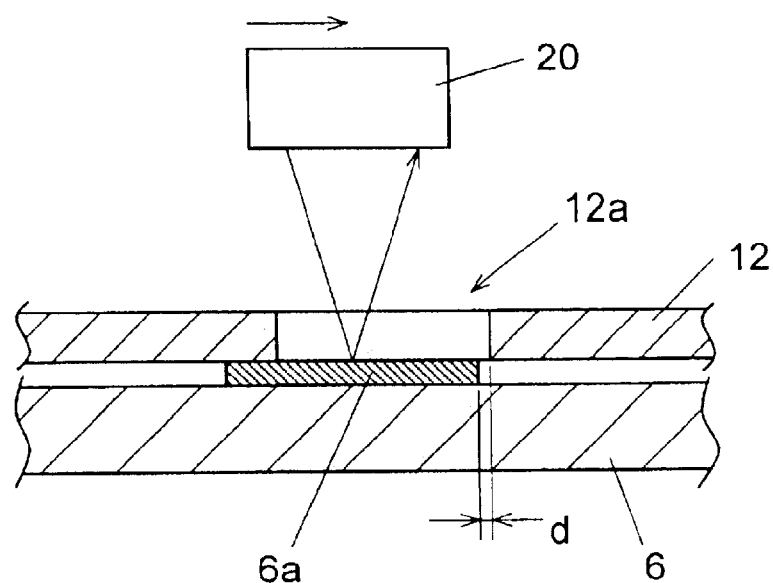
FIGS. 6A, 6B, 7A and 7B illustrate how a positioned status is detected at screen printing by the screen printing apparatus shown in FIG. 1.
Figure 6B:
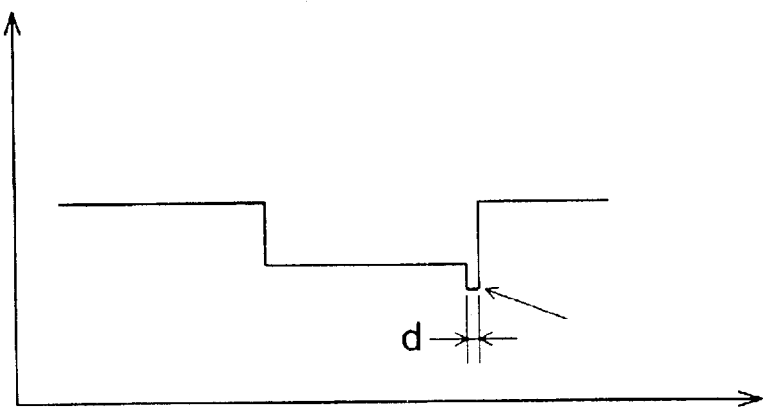

FIGS. 6A, 6B and FIGS. 7A, 7B illustrate two types of positioning defects. FIG. 6A illustrates that the relative position of substrate 6 to mask plate 12 deviates in the horizontal direction. In other words, pattern hole 12a is not exactly positioned on electrode 6a of substrate 6, and gap "d" is produced at the edge of pattern hole 12a. When this status is measured by laser measuring device 20 in a three-dimensional way, as FIG. 6B shows, an extra recess indicating the deviation and marked with an arrow appears on a recessed measuring line which illustrates a cross sectional shape of what is shown in FIG. 6A. Therefore, when this measuring line is compared with the normal one, a positional deviation in the horizontal direction can be detected.

Figure 7A:
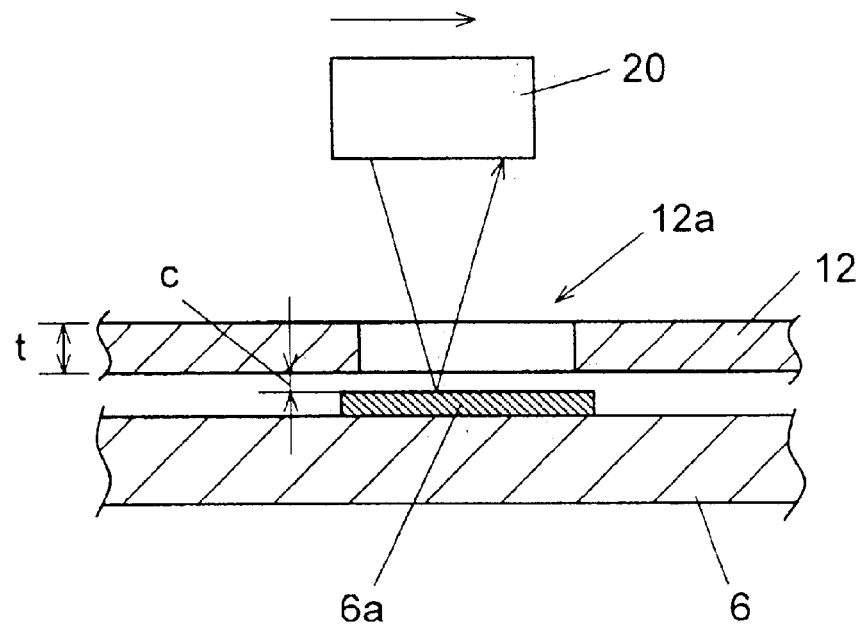
Figure 7B:
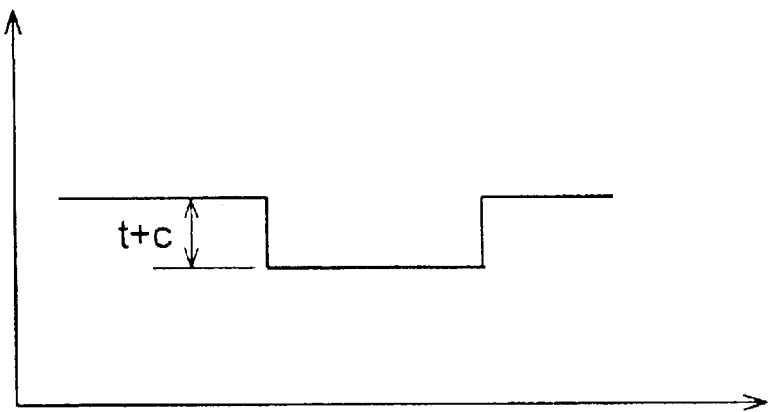

FIG. 7A illustrates that the relative position of substrate 6 to mask plate 12 deviates in the vertical direction. In other words, electrode 6a of substrate 6 is not exactly placed under and in contact with the lower face of mask plate 12, thereby producing gap "c". When this status is measure by device 20 in the three-dimensional way, as shown in FIG. 7B, the depth of recessed measuring line indicating pattern hole 12a appears deeper than mask thickness "t" by gap "c". Therefore, when the stepped measuring line indicating pattern hole 12a is compared with the normal dimensions, the positional deviation in the vertical direction can be detected.

When substrate 6 is placed under and in contact with the lower face of mask plate 12, head 13 is moved for squeegeeing. Then the upper face of mask plate 12 is three-dimensionally measured, so that a fill-in status of cream solder 9 into pattern hole 12a can be detected. The detection of the fill-in status is detailed with reference to FIG. 10A through FIG. 10C.

Figure 10A:
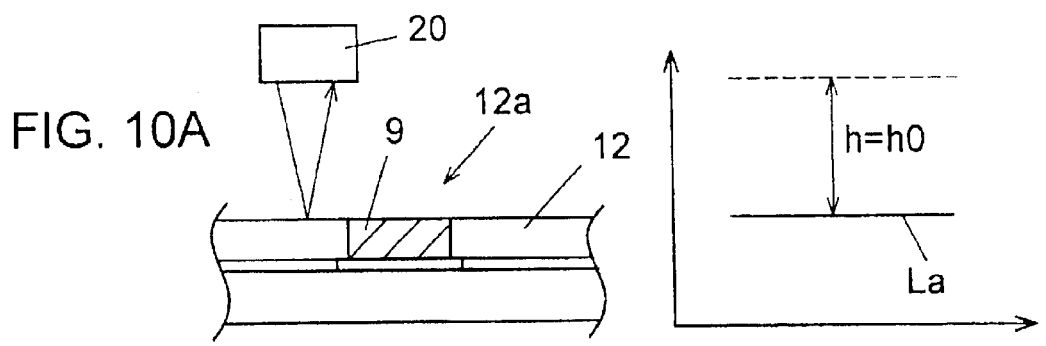
FIGS. 10A, 10B and 10C illustrate how to detect a fill-in status at screen printing by the screen printing apparatus shown in FIG. 1.
Figure 10B:
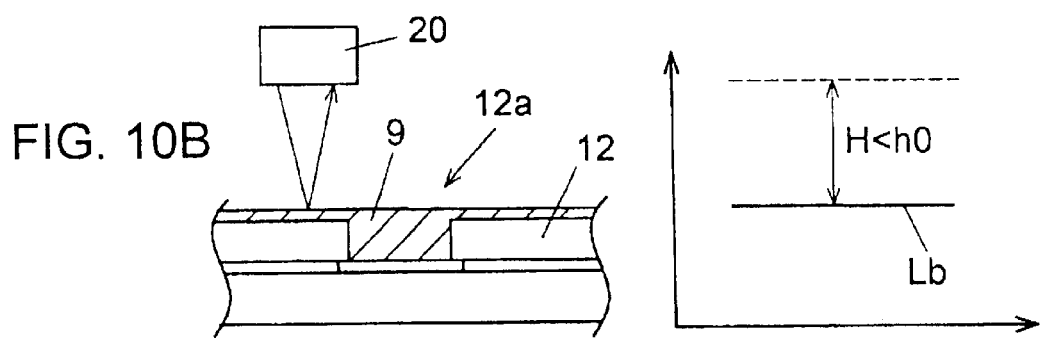
Figure 10C:
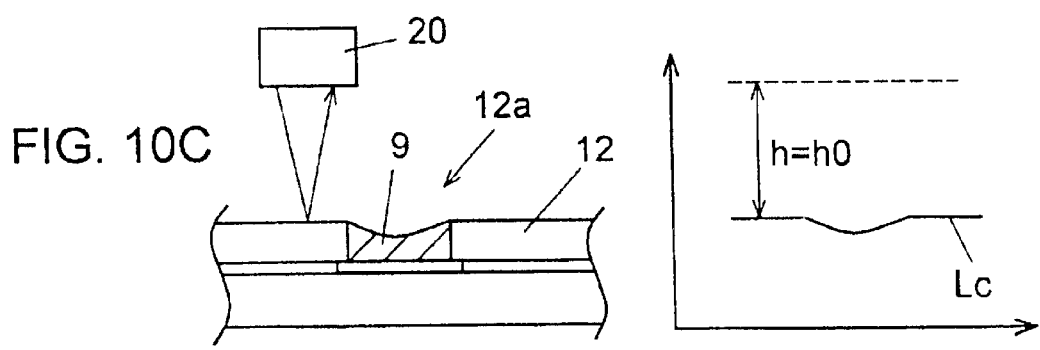

FIGS. 10A, 10B and 10C illustrate a normal fill-in status, an excess fill-in status and an insufficient fill-in status respectively, and also show measuring lines La, Lb and Lc obtained by laser measuring device 20.

When pattern hole 12a is filled normally with cream solder 9 as shown in FIG. 10A, measuring line La indicates the normal height h0 of the upper face of mask plate 12 including the range of pattern hole 12a.

When pattern hole 12a is filled excessively with cream solder 9 as shown in FIG. 10B, surplus cream solder 9 overflows pattern hole 12a. In this case, measuring line Lb reflects the surface of solder 9 and becomes different from the normal height h0.

When pattern hole 12a is filled insufficiently with cream solder 9 as shown in FIG. 10C, measuring line Lc indicates a partial recess within the range of a pattern hole 12a.

As discussed above, when the upper face of mask plate 12 undergone the squeegee operation is compared with the normal shape, the defect types of fill-in can be detected.

Figure 5:
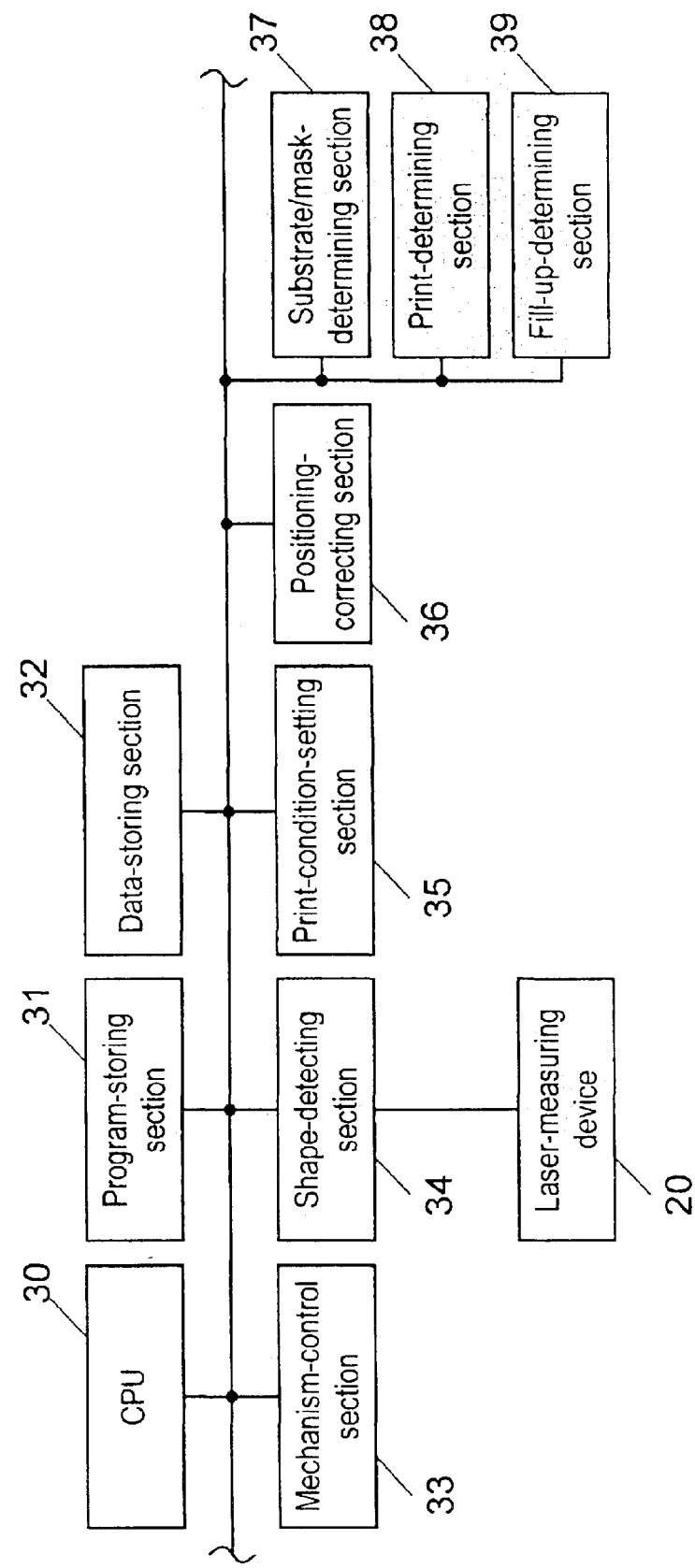
FIG. 5 is a block diagram illustrating a structure of a control system of the screen printing apparatus shown in FIG. 1.

A structure of the control system of the screen printing apparatus is described with reference to FIG. 5. In FIG. 5, CPU 30 is a controller governing individual sections described here. Program storing section 31 stores various programs such as, an operation program of screen printing, a processing program for detecting a shape of substrate 6 and mask plate 12 from a detecting signal of laser measuring device 20, a processing program for correcting a positioning of substrate 6 and mask plate 12, a determining program at a printing inspection, a processing program of preparing a printing condition and the like. Data memory 32 stores various data such as, reference data for determining a process at the printing inspection, printing condition data prepared for respective models together with printing condition library collecting the data necessary for setting the printing condition, printing position data, i.e., axis-driving-data for positioning substrate 6 relative to mask plate 12 by driving respective axes of substrate-positioning-section 1, reference data indicating three-dimensional measuring data at the normal fill-in of cream solder 9 in pattern hole 12a. In other words, data memory 32 functions as storing means for storing the printing position data and the printing condition.

Mechanism controller 33 controls operations of respective mechanical sections such as positioning section 1, carry-in conveyer 14, carry-out conveyer 15, X-axis table 21, Y-axis table 22. Shape detector 34 processes the detecting signal obtained by laser-measuring-device 20, so that an electrode placement pattern, an opening pattern showing the shape and placement of pattern hole 12a and a shape of cream solder printed on substrate 6 are detected. Thus the positioning status of substrate 6 with respect to mask plate 12 is detected.

Shape detector 34 detects a specific pattern hole 12a, and CPU 30 calculates the positional coordinates of the detected pattern hole 12a, thereby measuring the horizontal position of mask plate 12. In other words, shape detector 34 and CPU 30 function as mask position measuring means for detecting the horizontal position of mask plate 12.

Printing condition setter 35 prepares screen printing conditions, such as a squeegeeing speed, a printing pressure (an urging value of squeegee 13a against mask plate 12), a relative releasing speed of substrate 6 from mask plate 12 just after the printing. These parameters are prepared responsive to the characteristics of a printing object. The screen printing conditions are modified or changed based on a fill-in status detection result and a printing determination result, both being detailed later. In other words, printing condition setter 35 functions as printing-condition-modifying means for modifying the printing conditions based on the fill-in status detection result.

Position correcting section 36 (position correcting means) corrects a positioned status based on the positioned-status-detection result which has been obtained by three-dimensional measuring of mask plate 12 from its above, where substrate 6 is placed under and in contact with the lower face of plate 12. The relative positions of substrate 6 to mask plate 12 in both the horizontal and vertical directions are detected, and are compared with the reference data stored, so that deviations are found. Finally, the positioned status is corrected to an exact positioned status.

Substrate and mask determiner 37 compares an electrode-placement-pattern detected by shape detector 34 and an opening pattern of mask plate 12 with the reference pattern of the design data, thereby determining whether or not substrate 6 and mask plate 12 supplied to the apparatus are acceptable.

Print determiner 38 compares the data about the shape of cream solder 9 with the reference data stored, thereby determining whether or not the print is acceptable. The data has been obtained by measuring substrate 6 undergone the screen print with laser measuring device 20.

Fill-in status determiner 39 compares the three-dimensional data about the upper face of mask plate 12, on which cream solder 9 has been filled, with the reference data stored in data memory 32, thereby determining whether or not the fill-in status of cream solder into pattern hole 12a is acceptable. Shape detector 34 has detected the upper face of mask plate 12, where the cream solder was filled in.

Next, the preparation of the printing conditions is described. FIG. 9 shows data content of printing-condition-library. In this library, a combination of the parameters (squeegeeing speed, print pressure, releasing speed, and releasing distance which indicates a relative moving distance) is assigned to respective couples of a typical dimension of an electrode (e.g. width of the electrode) and a typical dimension of the screen mask (e.g. thickness of the mask plate) where pattern holes are provided. These parameters takes different values depending on the physical properties of cream solder 9.

A type of cream solder 9, substrate 6 to be printed, and screen mask 10 to be used, are designated by the typical dimension of the electrode and the typical dimension of the mask, whereby parameters corresponding to the combination are selected. The parameters selected are automatically prepared. The screen printing apparatus of the present invention is thus structured.

A method of screen printing is described hereinafter. A first embodiment of the screen printing method is demonstrated. First, a model is changed in a production line. Screen mask 10 is prepared for the newly introduced model, and the mask is inspected. As shown in FIG. 1, this inspection is carried out by three-dimensional measuring, i.e., laser measuring device 20 is moved above mask plate 12 by X-axis table 21 and Y-axis table 22, thereby measuring mask plate 12. The thickness of mask plate 12 is measured and an acceptance of the mask is determined through the mask inspection.

Next, substrate 6 is inspected. As shown in FIG. 2, carry-in conveyor 14 carries substrate 6 onto substrate-positioning-section 1, then substrate-positioning-section 1 under mask 10 is moved in Y-direction (marked with an arrow in FIG. 2) to a substrate-measuring-position (section 1 and substrate 6 drawn in broken lines in FIG. 2.) Then a width and a length of an electrode, onto which a printing is carried out, formed on substrate 6 can be measured.

A trial printing is carried out before an actual printing. First, supply cream solder 9 on mask plate 12, then shuttle squeegee 13a back and forth for tempering solder 9 (preparatory squeegeeing.) Second, raise Z-axis table 5 of substrate-positioning-section 1 so that substrate 6 is placed under and in contact with the lower face of mask plate 12, thereby positioning substrate 6 to mask plate 12.

After the positioning, a positioned status is detected. To be more specific, move laser-measuring-device 20 above mask-plate 12, then measure the position of a given pattern hole specified as a detecting position. Thus positional deviations of substrate 6 from mask plate 12 in the horizontal and vertical directions are detected, i.e., the positioned status is detected.

Based on the positioned status detected, X-axis table 2, Y-axis table 3 and Z-axis table 5 are controlled and driven by CPU 30 and mechanism controller 33, so that the positional deviation is corrected, and substrate 6 is exactly positioned to mask plate 12. CPU 30 and mechanism controller 33 function as controlling means for correcting the positioned status by controlling the substrate positioning means based on the positioned-status detection result.

Then carry out squeegeeing for filling solder 9 into respective pattern holes 12a. After that, lower Z-axis table 5 to release substrate 6 from mask plate 12, thereby completing the print of solder 9 on electrode 6a of substrate 6.

Then inspect the trial print on substrate 6. In this inspection, positioning section 1 is moved again from under mask 10 to the substrate-measuring-position, and substrate 6 is three-dimensionally measured from its above by device 20. When this inspection determines that the print status is acceptable, the printing conditions are determined properly. Then an actual print starts based on the proper printing conditions.

A second embodiment of the screen printing method is demonstrated here. First, as same as the first embodiment, a model is changed and a newly introduced model is put on a production line. Screen mask 10 is mounted responsive to the new model. Substrate 6 is positioned to mask plate 12 before a trial print is carried out. This positioning is carried out by driving substrate-positioning-section 1 based on the print-position-data stored in data memory 32, so that substrate 6 is raised by Z-axis table 5 while being positioned in the horizontal direction, and finally placed under and in contact with the lower face of mask plate 12.

Figure 8A:
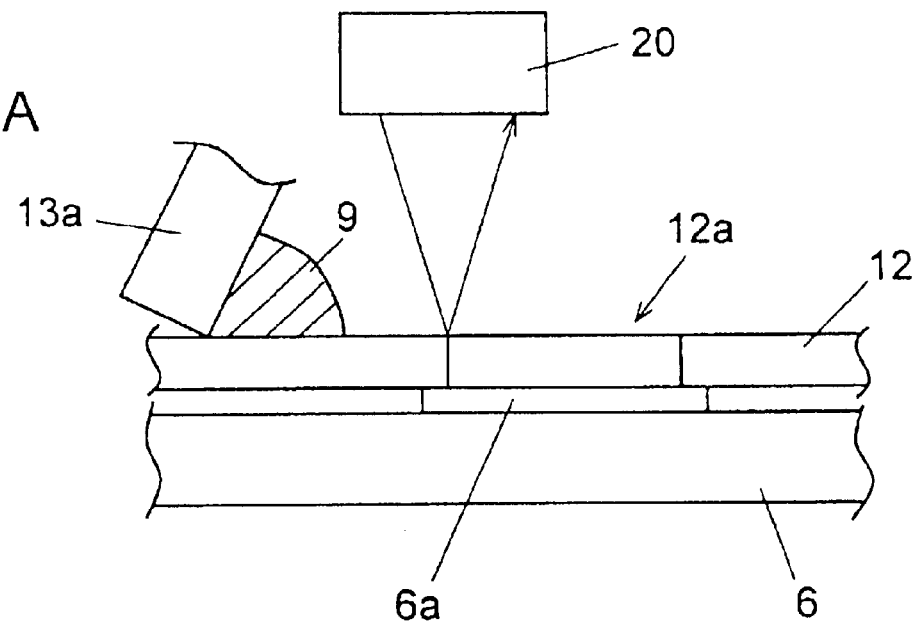
FIGS. 8A and 8B illustrate how to measure a positional deviation of a mask plate at screen printing by the screen printing apparatus shown in FIG. 1.

Next, a mask position is measured. As shown in FIG. 8A, mask plate 12 is three-dimensionally measured from its above by moving laser-measuring device 20 above screen-mask 10 with X-axis table 21 and Y-axis table 22. Thus the horizontal position of mask plate 12 is measured. This horizontal position can be measured also by using a specific pattern hole 12a for position-measuring, or by measuring a position-measuring-dedicated hole.

Figure 8B:
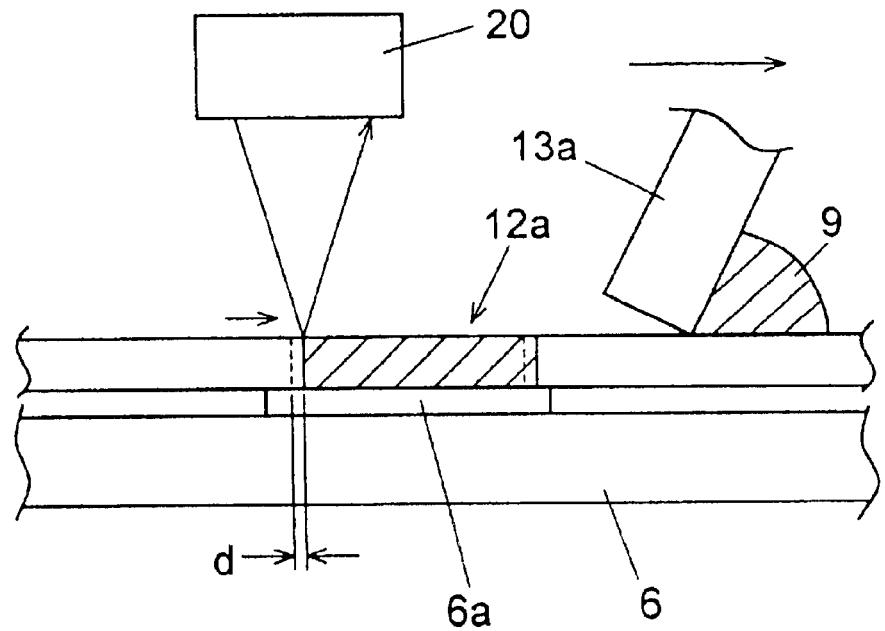

Then printing is carried out. Squeegee 13a is urged against mask plate 12, and squeegee head 13 is moved so that cream solder 9 is filled in pattern holes 12a, and as shown in FIG. 8B, device 20 is moved to measure the pattern hole 12a which has been measured as a measuring point before this printing. Thus a horizontal shift of mask plate before and after the printing, i.e., a positional deviation "d" of mask plate 12 due to the printing action is detected. This deviation of the mask is measured with respect to a plurality of squeegees 13a in respective sequeegeeing directions. The print position corrected based on the deviation data is stored in data memory 32 as a new print position data.

Based on the data about the positional deviation detected, the data other than print position data, e.g., a data contributing to the positional deviation of the mask plate, can be modified. In other words, mask plate 12 is shifted by squeegee 13a, thereby producing the deviation discussed above. Therefore, a pressure urging squeegee 13a or a squeegeeing speed is changed, thereby restraining the positional deviation.

When substrate 6 is re-positioned based on the new print position data corrected, the trial print is carried out again. To be more specific, after the print the same as the previous one, the mask position is measured again. When an exact mask position is confirmed, substrate 6 is released from mask plate by lowering Z-axis table 5. Thus solder 9 is exactly printed on electrode 6a of substrate 6.

Then inspect the trial print on substrate 6. In this inspection, positioning section 1 is moved again from under mask 10 to the substrate-measuring-position, and substrate 6 is three-dimensionally measured from its above by laser-measuring-device 20. When this inspection determines that the print status is acceptable, an actual print starts.

As discussed above, the second embodiment of the screen printing method includes the following steps: When substrate 6 is positioned to mask plate 12, the horizontal position of mask plate 12 is measured, thereby obtaining the positional deviation of mask plate 12 due to the printing action. The print position data at actual printing is corrected by that deviation. As a result, the deviations due to deformation of mask plate 12 over time and looseness of mounting the mask plate 12 can be corrected. Quality print without any print deviation is thus obtainable.

A third embodiment of the screen printing method of the present invention is demonstrated here. First, a model is changed and a new model is introduced in a production line. Screen mask 10 is mounted responsive to the new model, and the mask is inspected. As shown in FIG. 1, this inspection is carried out by three-dimensional measuring, i.e., laser measuring device 20 is moved above mask plate 12 by X-axis table 21 and Y-axis table 22, thereby measuring mask plate 12. The thickness of mask plate 12 is measured and an acceptance of the mask is determined through this mask inspection.

Next, substrate 6 is inspected. As shown in FIG. 2, carry-in conveyor 14 carries substrate 6 onto substrate-positioning-section 1, then substrate-positioning-section 1 under mask 10 is moved in Y-direction (marked with an arrow in FIG. 2) to a substrate-measuring-position (section 1 and substrate 6 drawn in broken lines in FIG. 2.) Then a width and a length of an electrode, onto which a printing is carried out, formed on substrate 6 can be measured.

The procedure of the third embodiment up to this point is the same as that of the first embodiment.

The typical dimension of the electrode and the thickness of mask plate 12 are found. Then the parameters of printing conditions in printing-condition-library are read based on a type of cream solder 9 already input, data of substrate 6 and screen mask 10 both the data have been measured. The parameters are used in the trial printing.

At the trial printing, first, supply cream solder 9 onto screen mask 10, and shuttle back and forth squeegee 13a to temper solder 9 (preparatory squeegeeing). Then raise Z-axis table 5 of substrate-positioning-section 1 so that substrate 6 is placed under and in contact with mask plate 12. Next, move squeegee head 13 on mask plate 12 to fill solder 9 into pattern holes 12a. In this status, move laser-measuring-device 20 above mask plate 12 to detect the fill-in status of solder 9.

Based on this fill-in status detected, the printing conditions are corrected. To be more specific, in the case of an excessive fill-in status, namely solder 9 overflows pattern holes 12a, a print pressure should be increased for instance. In the case of insufficient fill-in status, e.g., the print pressure should be lowered. These corrections of the print conditions are made based on experimental values stored as data. The print conditions corrected are stored in memory 32, thereby updating the print conditions.

After the print conditions are updated, the trial print is carried out again. When the fill-in status is determined proper at this trial print, Z-axis table 5 is lowered for releasing substrate 6 from mask plate 12, whereby solder 9 is printed on electrode 6a of substrate 6. Then substrate 6 undergone the print is inspected. In this inspection, positioning section 1 is moved again from under mask 10 to the substrate-measuring-position, and substrate 6 is three-dimensionally measured from its above by device 20. When this inspection determines that the print status is acceptable, the parameters of the print conditions read out are determined proper, and these parameters are set for an actual print and stored in data memory 32.

If a defect is found at the inspection after the trial print, feed back process of the print conditions works based on feed-back data stored in the print condition library. In other words, the inspection result outputs numerical data to respective items such as a print area, a print height of each electrode. These numerical data are compared with the reference values prepared as proper values, thereby finding deviations from the reference values.

These deviations allow the parameters correlated to be corrected to negative or positive side by a correction amount responsive to the deviations. The data of this correlation between the deviation and the correction amount are collected from the results of the trial prints which have been carried out systematically by changing respective print conditions in various ways. The results of the trial prints have been statistically processed. The data of the correlation are also stored in the print condition library of data memory 32.

After the print conditions are corrected, another trial print is carried out, and the print result is inspected. An actual print starts after the print result is determined acceptable. Throughout the actual printing, the print conditions are fed back at given intervals, namely, substrates 6 undergone the print process are inspected by device 20 on sampling base.

The data are collected from the inspections, and deviations from the reference values of respective inspection items are found, then some of the parameters, if necessary, are corrected, thereby changing the print conditions for the actual print. Through this procedure, even if the viscosity of solder 9 is varied due to temperature change, the print conditions can be always kept in a proper range. As a result, quality print can be maintained.

As discussed above, the screen printing method of the present invention carries out the following procedure: First, measure mask plate 12 undergone a squeegeeing operation from its above in a three-dimensional way, so that the fill-in status of cream solder 9 is detected. Then based on the detection result, correct the screen print conditions. As a result, a complicated work of preparing the print conditions based on human eyes by skilled workers can be done with ease, and the print conditions can be prepared without dispersion. Thus stable print quality is obtainable.

In the embodiments discussed above, an open type squeegee head having board-shaped squeegee 13a is used; however, the squeegee head is not limited to this example, and a closed type squeegee head can be used. This head is filled with the cream solder inside thereof, and the head is slid on the mask plate while pressure is applied to the cream solder, thereby filling the cream solder into the pattern holes.

In short, according to the present invention, the mask plate, to which a substrate is positioned, is three-dimensionally measured from its above, thereby detecting a positioned status. Based on the detection result, the positioned status is corrected. Therefore, an exact positioning can be always expected and stable print quality is obtainable.

A horizontal position of the mask plate, to which the substrate is positioned, is measured before and after a printing action, so that a positional deviation of the mask plate due to the printing action can be measured. Based on the detection result, print condition data is corrected. Therefore, an exact print position is always maintainable.

A screen mask, of which pattern holes are filled with the cream solder, is three-dimensionally measured from its above, thereby detecting a fill-in status of the cream solder. Based on the detection result, screen print conditions are corrected. Therefore, the print conditions can be prepared easily without dispersion.

What is claimed is:

1. A method of screen printing, said method comprising the steps of:

(a) detecting a position of a mask plate having a pattern hole relative to a substrate;

(b) three dimensionally determining an extent to which said hole is filled with paste; and (c) modifying printing on said substrate using said mask based on said determined extent.

2. A method of screen printing as defined in claim 1, wherein printing is modified by changing a speed at which a squeegee is slid on said mask, and an amount of pressure with which the squeegee is urged against the mask plate.

3. Screen printing apparatus comprising:

(a) a positioner for positioning a substrate relative to a mask plate having a pattern hole;

(b) a fill-in detector for three dimensionally determining an extent to which said hole is filled with solder;

(c) a print-condition correction unit for modifying printing on said substrate using said mask based on said determined extent.

* * * * *